(12) United States Patent
Schie

(10) Patent No.: US 9,397,207 B2
(45) Date of Patent: Jul. 19, 2016

(54) GATED THYRISTOR POWER DEVICE

(71) Applicant: David Schie, Cupertino, CA (US)

(72) Inventor: David Schie, Cupertino, CA (US)

( * ) Notice: Subject to any disclaimer, the term of this patent is extended or adjusted under 35 U.S.C. 154(b) by 0 days.

(21) Appl. No.: 14/828,326

(22) Filed: Aug. 17, 2015

(65) Prior Publication Data

US 2016/0133734 A1    May 12, 2016

Related U.S. Application Data

(62) Division of application No. 14/214,816, filed on Mar. 15, 2014, now Pat. No. 9,142,657.

(51) Int. Cl.
*H01L 29/66* (2006.01)
*H01L 21/332* (2006.01)
*H01L 29/745* (2006.01)
*H01L 29/74* (2006.01)

(52) U.S. Cl.
CPC ........ *H01L 29/7455* (2013.01); *H01L 29/7404* (2013.01); *H01L 29/7408* (2013.01)

(58) Field of Classification Search
CPC .......................... H01L 27/0921; H01L 29/745
USPC ................................ 257/147, 157, 173, 111, 257/E29.046–E29.225; 438/133–139
See application file for complete search history.

(56) References Cited

U.S. PATENT DOCUMENTS 9,142,657 B2 *  9/2015  Schie .................... H01L 29/102
                                                              257/147

* cited by examiner

*Primary Examiner* — Calvin Lee
(74) *Attorney, Agent, or Firm* — Weiss & Moy, P.C.; Jeffrey D. Moy

(57) ABSTRACT

An improved gated thyristor that utilizes less silicon area than IGBT, BIPOLARs or MOSFETs sized for the same application is provided. Embodiments of the inventive thyristor have a lower gate charge, and a lower forward drop for a given current density. Embodiments of the thyristor once triggered have a latch structure that does not have the same Cgd or Ccb capacitor that must be charged from the gate, and therefore the gated thyristor is cheaper to produce, and requires a smaller gate driver, and takes up less space than standard solutions. Embodiments of the inventive thyristor provide a faster turn off speed than the typical >600 ns using a modified MCT structure which results in the improved tail current turn off profile (<250 ns). Additionally, series resistance of the device is reduced without comprising voltage blocking ability is achieved. Finally, a positive only gate drive means is taught as is a method to module the saturation current using the gate terminal.

10 Claims, 6 Drawing Sheets

GATED THYRISTOR POWER DEVICE

CROSS-REFERENCE TO RELATED APPLICATION

This application is a divisional of U.S. patent application Ser. No. 14/214,816, filed Mar. 15, 2014, now U.S. Pat. No. 9,142,657 issued Sep. 22, 2015, which claims priority to U.S. Provisional Patent Application Ser. No. 61/787,603 filed Mar. 15, 2013, which is incorporated herein by reference.

FIELD OF THE INVENTION

The present invention in general relates to electronic components in particular to an improved gated thyristor power device.

BACKGROUND OF THE INVENTION

Pass elements generally represent the largest semiconductor area of AC/DC converters, DC/AC inverters and high voltage DC/DC converters. For that reason a lot of effort has been spent optimizing the figures of merit (such as Rdson or gate charge) for pass elements in various applications, but that effort has primarily been focused upon metal-oxide-semiconductor field-effect transistor (MOSFET), insulated-gate bipolar transistor (IGBT), and BIPOLAR transistor optimization.

Thyristors have long been accepted as the highest current density devices available, however, thyristor use has been limited in switching power supplies due to their slow turn off capabilities, and little work has been done to utilize such devices in lower power (<1000 W) applications with fast switching frequencies (>20 kHz). In addition, most commercially available thyristors come in a silicon-controlled rectifier (SCR) form and cannot be actively turned off and are complex to drive.

Metal-oxide-semiconductor (MOS) controlled thyristors (MCT) are devices with a high impedance gate structure which can be turned on and off utilizing a voltage on the high impedance gate. An equivalent schematic is shown in FIG. 1. The device works by injecting carriers into an SCR latch structure and then removing those carriers by shorting one of the base-emitter junctions of the equivalent bipolar transistors in the SCR latch structure equivalent schematic.

There are six significant issues which have reduced the use of gate turn off thyristors in lower current, switching power supply applications:
1. Slow turn off speed—typically >600 ns even for 600V devices. Switching AC/DC converters need to be <250 ns to start to be considered for use.
2. Maximum turn off current—if exceeded the device cannot be turned off.
3. Requirement for a plus/minus gate drive, requiring the creation of a negative rail.
4. The perception that the device could "latch on" from noise and therefore is not reliable.
5. Thyristors generally have no gate controlled current saturation region to control the turn on and turn off commutation. Thyristors also have an asynchronous on and off time with the turn on time being far quicker than the turn off time. IGBT, MOSFETs, and BIPOLARs transistors have a gate voltage controlled current saturation region between fully on and fully off, where the voltage on the gate can be used to control the turn on characteristics of the switch. Thus thyristors must be designed for a specific turn on characteristic limiting the applications of any one device, or expensive and potentially lossy snubbers must be incorporated (to reduce electromagnetic interference (EMI), prevent overvoltage, and improve efficiency compared to unsnubbered implementations). As snubbers often would not be required in low current applications, this makes gated thyristors far less attractive.
6. Customers are experienced with IGBTs, BIPOLARs and MOSFETs, and a considerable number of drivers, test data, application notes are available for their use, and any differences to what customers are used to are usually not tolerated.

It would therefore be desirable to produce a gated thyristor that overcomes the aforementioned problems, with a resulting device that would utilize less silicon area than an IGBT, BIPOLAR or MOSFET sized for the same application. In addition, it would be desirable to have a thyristor with a lower gate charge, and a lower forward drop for a given current density. Furthermore, it would be desirable to produce a gated thyristor where once triggered the latch structure does not have the same Cgd or Ccb capacitor that must be charged from the gate, and therefore the desired gated thyristor has the potential to be both cheaper, require a smaller gate driver, and take up less space than standard solutions.

SUMMARY OF THE INVENTION

An improved gated thyristor that utilizes less silicon area than IGBTs, BIPOLARs or MOSFETs sized for the same application is provided. Embodiments of the inventive thyristor have a lower gate charge, and a lower forward drop for a given current density. Embodiments of the thyristor have a latch structure that does not have the same Cgd or Ccb capacitor that must be charged from the gate, and therefore the gated thyristor requires a smaller gate driver, and takes up less space than standard solutions. Embodiments of the inventive thyristor provide a faster turn off speed than the typical >600 ns using a modified MCT structure which results in the improved tail current turn off profile (<250 ns).

Embodiments of the inventive thyristor realize faster turn off speeds with a structure which inserts multiple p diffusions into the high voltage drift region. We then dope the resulting n and p alternating regions similarly, but at a higher doping concentration than would be possible if only an n drift region were used to block a given reverse voltage. Now, if the device is blocking high voltage then the n and p region form a depletion region with a resulting n-drift concentration similar to a more lightly doped intrinsic n-region because of the depletion so that it can block as it would with an intrinsic lighter n doping concentration. But if the device is on, then the p and n region do not create a wide depletion region and therefore during turn off, the higher n concentration in the drift region, which is a base region where carriers must recombine in the schematic equivalent model, will increase the chances that electrons and holes meet each other during turn off and will thus increase the rate of recombination. This turn off acceleration method has the additional benefit of reducing the resistance of the n-drift region because it is more highly doped when on.

BRIEF DESCRIPTION OF THE DRAWINGS

The present invention is further detailed with respect to the following drawings. These figures are not intended to limit the scope of the present invention but rather illustrate certain attributes thereof.

FIG. 5 is the same as FIG. 4 but with a positive threshold implant to make the turn off MOSFET normally on so that the device may operate with only a positive polarity rather than requiring a positive and negative gate drive. The B indicates Boron or a positive dopant implanted at the surface to make the vbe shorting p-channel mosfet normally on;

DESCRIPTION OF THE INVENTION

The present invention has utility as an improved gated thyristor that utilize less silicon area than IGBTs, BIPOLARS or MOSFETs sized for the same application. Embodiments of the inventive thrystor have a lower gate charge, and a lower forward drop for a given current density. Embodiments of the thyristor once triggered have a latch structure that does not have the same Cgd or Ccb capacitor that must be charged from the gate, and therefore the gated thyristor is cheaper to produce, and requires a smaller gate driver, and takes up less space than standard solutions.

Typically, existing gated turn off thyristors have an extremely high current density but cannot switch fast enough (<250 ns turn off) and have other non-idealities which keep prior art thyristors from being adopted as a replacement for MOSFETs, BIPOLARs and IGBTs in lower power (<1000 W) applications such as AC/DC converters. Inventive embodiments provide improvements to the thyristor structure as well as complimentary circuits are taught to improve the thyristor device or use of the device so that embodiments of the inventive thyristor may be used as a replacement for MOSFETs, BIPOLARs and IGBTs in these types of applications.

Figure 6:
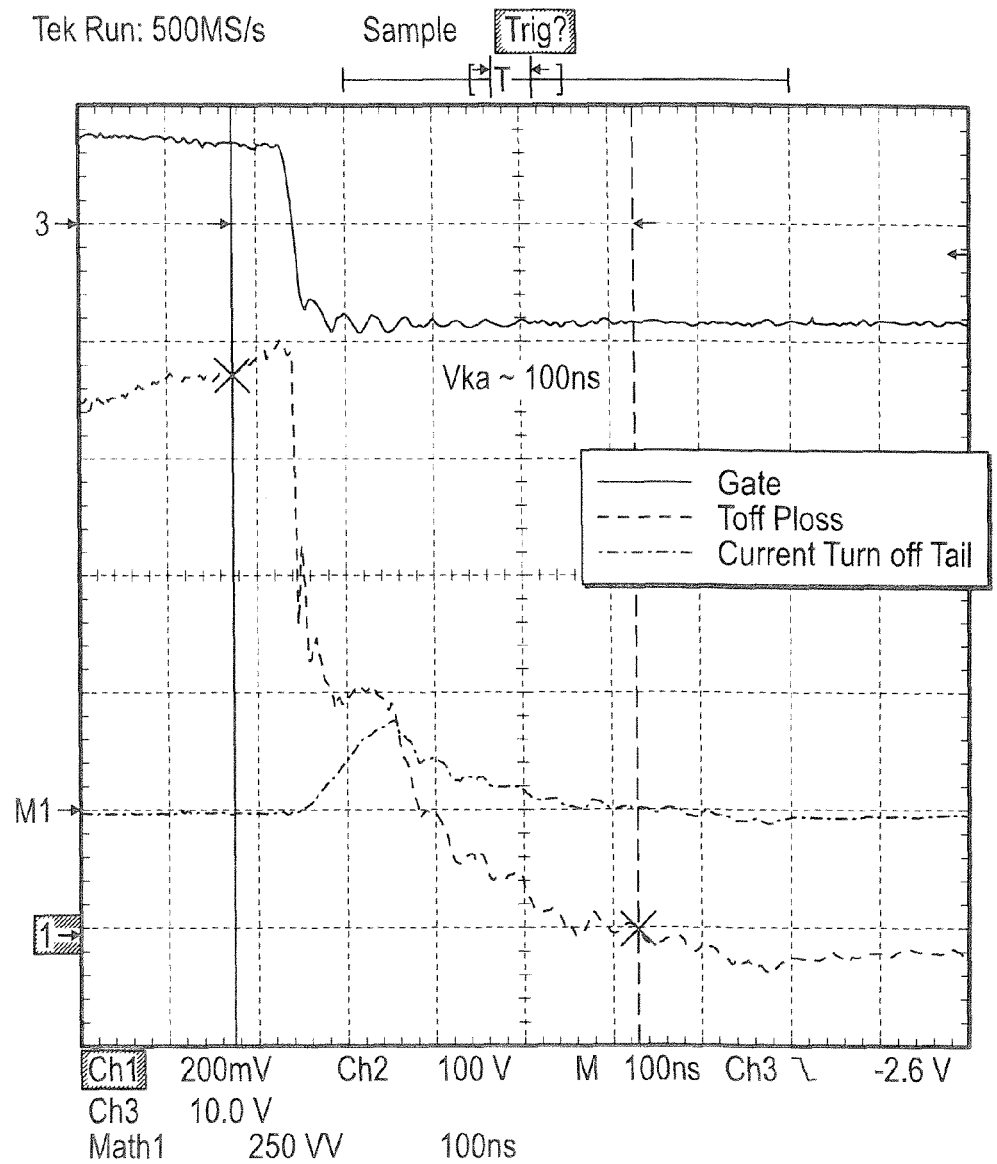
FIG. 6 shows a graph of the voltages and currents on and through the terminals of the gated turn off thyristor during turn off.

Embodiments of the inventive thyristor provide a faster turn off speed than the typical >600 ns using a modified MCT structure which results in the improved tail current turn off profile as shown in the graph of FIG. 6 (<250 ns). The graph of FIG. 6 shows the voltages and currents on and through the terminals of the gated turn off thyristor during turn off. The slow tail found with traditional thyristors is caused by the slow recombination of carriers in the equivalent SCR latch structure schematic base regions, especially in the high voltage (epi) drift region. Turn off thyristor structures therefore have not been able to achieve less <250 ns turn off times that are required by switching AC/DC converters. The improvement achieved by embodiments of the inventive gated thyristor is created by utilizing one or a combination of techniques to enhance recombination in the base regions of the SCR structure when the equivalent vbe is shorted. Recombination can be enhanced by: i) irradiation; ii) gold or platinum doping; iii) using a depletion structure means to increase the effective concentration in the drift region at the start of turn off. Irradiation and gold and/or platinum doping encourage recombination by providing recombination sites and increasing the chance that holes and electrons find each other.

Figure 1:
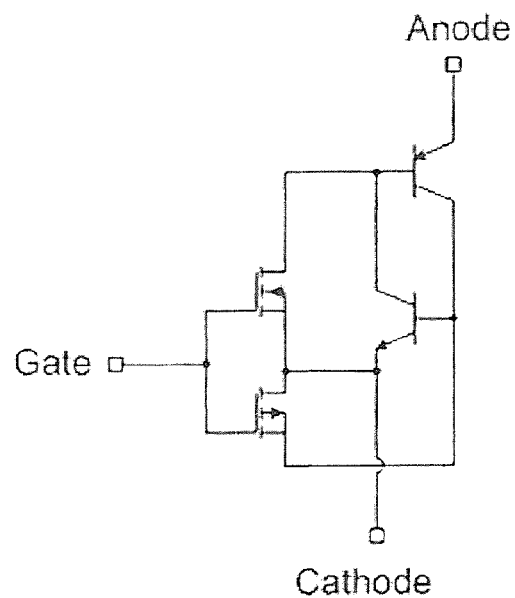
FIG. 1 is the equivalent schematic of a gated turn off thyristor.
Figure 2:
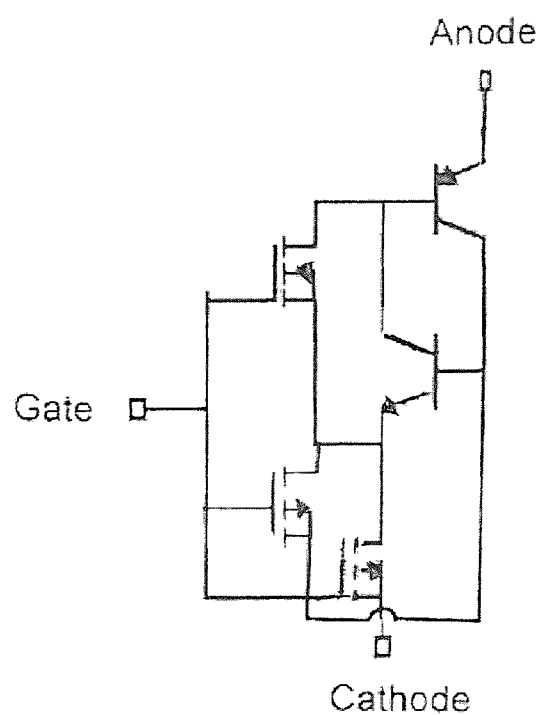
FIG. 2 is an equivalent schematic of a gated turn off thyristor with gate control current saturation.
Figure 3:
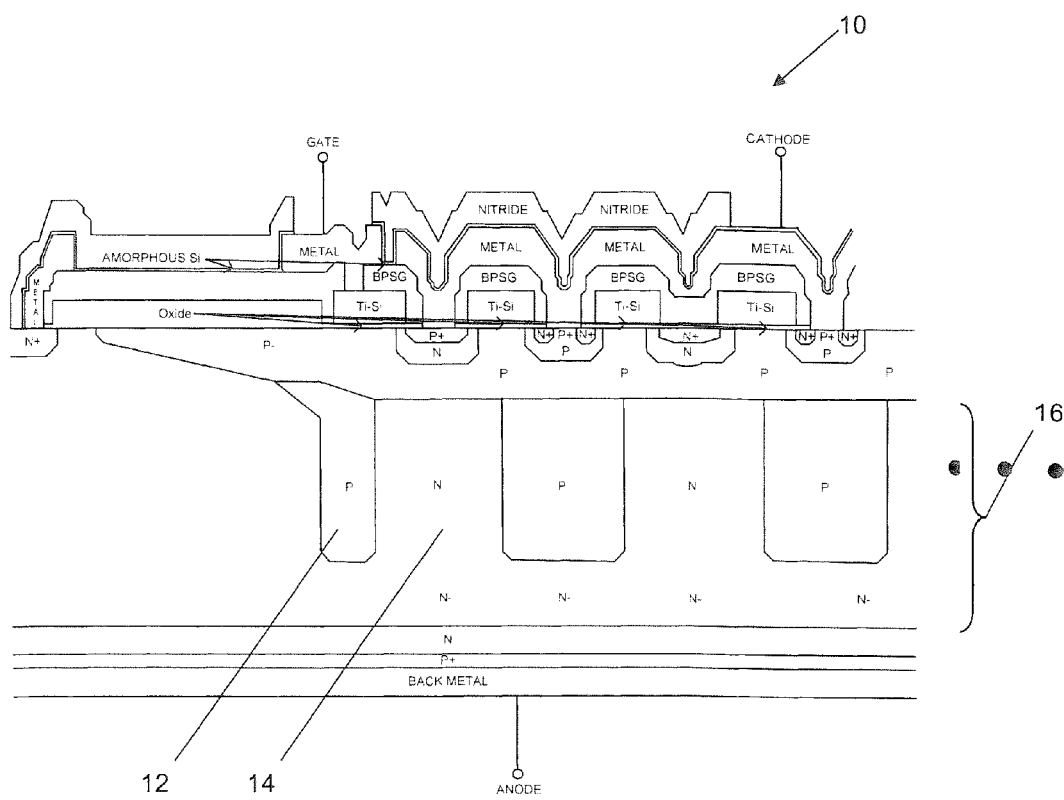
FIG. 3 is a partial cross section of a core cell (termination and repeated power channel) of the gated turn off thyristor with gate controlled current saturation and improved turn off time, as well as reduced drift region on resistance (Note the n-channel turn on device is further to the right and cutoff in this diagram (see FIG. 4))

FIG. 3 is a partial cross section of a core cell (termination and repeated power channel) of an inventive embodiment of a gated turn off thyristor with gate controlled current saturation and improved turn off time, as well as reduced drift region on resistance. The inventive thyristor 10 realizes faster turn off speeds with a structure which alternates n 14 and p 12 diffusions in the high voltage drift region 16 as shown in FIG. 3. The n 14 and p 12 regions are doped similarly, but at a higher doping concentration (perhaps an order of magnitude higher) than would be possible if only an n drift region were used. Basically, if the device is blocking high voltage then the n and p region form a depletion region with a resulting n-drift concentration similar to a more lightly doped n-region because of the depletion so that it can block as it would with a lighter n doping concentration. But if the device is on, then the p and n region do not create a wide depletion region and therefore at the start of and during turn off, the higher n concentration in the drift region, which is a base region where carriers must recombine in the schematic equivalent model, will increase the chances that electrons and holes meet each other during turn off and will thus increase the rate of recombination. This turn off acceleration method has the additional benefit of reducing the resistance of the n-drift region because it is of a higher effective concentration when on.

Embodiments of the inventive thyristor provide provisions to prevent the maximum turn off current from being exceeded and creating a situation where the device cannot be turned off, by employing one or more of three techniques. The first technique is to utilize a turn off circuit. The turnoff circuit utilizes a metal strip or other form of sense resistor and turns off the thyristor structure before it exceeds a maximum. An NTAT reference (negative temperature coefficient) can be used so as to consider the effect of temperature and avoid thermal runaway. The second method utilizes the structure of FIG. 3, which effectively connects the MCT cathode to the drain of an integrated n-channel MOSFET (integrated at the repeated device cell level where parallel cells make up an overall power device) whose source is connected to the outside cathode connection. Ie. The MOSFET is in series with the MCT structure. This device configuration will now have the current limiting abilities of a MOSFET, and therefore the device will self-protect to a degree (as the MOSFET does not thermally runaway) however, this structure enables a current saturation region controlled by the high impedance gate. It is now also possible to mirror these series MOSFETs to replica MOSFETs outside the power device to create a replica current. This sense-MCT structure allows current to be measured without a series resistive element (which increases Ron). A circuit similar to that described above can then utilize this current and compare the current to a reference. This time, however, the current may be limited to a maximum, folded back or the device shutdown as there is now a saturation current control mechanism due to the series MOSFET. Note that the series MOSFET is a low voltage MOSFET as it does not contain the n-drift region. Nevertheless, having this MOSFET in series does increase the series resistance of the overall device, however, is still far superior to a MOSFET or IGBT alone. A final method would be to put a series device in series with this new structure to measure current and utilize a similar current limiting, turn off or foldback means to that described above.

Embodiments of the inventive thyristor address the requirement for a positive and negative (plus/minus) gate drive that requires the creation of a negative rail that has reduced the use of gate turn off thyristors in lower current, switching power supply applications as follows. In a first configuration, a charge pump may be included monolithically with the power device to create a negative rail. The control input, presently the high impedance gate of the MCT, is instead coupled to a driver which accepts a control voltage between gnd and a positive voltage where said driver couples said negative rail to the actual MCT gate when said control voltage is below a threshold and a positive voltage level to the MCT gate when above said threshold. In this way it is possible to create an overall device which is used like a normal enhancement type device (zero or positive control voltages only) even while the MCT is being gated with positive and negative control signals on its gate internal to the device. A second method is to dope the channel of the turn off p-channel device which shorts the equivalent base emitter junction of the SCR latch structure using a positive dopant such as Boron to make it normally on. As a normally on device the gate must be raised to a higher voltage before it stops shorting the latch structure and the structure can turn on. The second method is also effective in overcoming the perception that the gated thyristor devices could "latch on" from noise and therefore are not reliable, since the structure is immune to glitches as it is effectively "normally off." The structure of FIG. 3 solves this problem automatically as the series MOSFET is normally off and cannot turn on without a positive gate bias.

As noted above, thyristors generally have no gate controlled current saturation region to control the turn on and turn off commutation, and also have an asynchronous on and off time with the turn on being far quicker than the turn off. Thus thyristors must be designed for a specific turn on characteristic limiting the applications of any one device, or expensive and potentially lossy snubbers must be incorporated (to reduce EMI, prevent overvoltage, and improve efficiency compared to unsnubbered implementations). As snubbers often would not be required in low current applications, this makes gated thyristors far less attractive for use in these applications. However the inventive structure of FIG. 3 solves the design problem in that the MOSFET now becomes the saturation control element. Once the latch turns on the current is still limited through it by the MOSFET, which is in turn controlled by the voltage on the shared gate.

The utilization of the combined inventive techniques above allow the inventive structure to have the benefits of a gate turn off thyristor structure with the ease of use and applications methods presently used for IGBTs, BIPOLARs and MOSFETs, which eases the adoption of gated thyristors in the market by customers.

Figure 4:
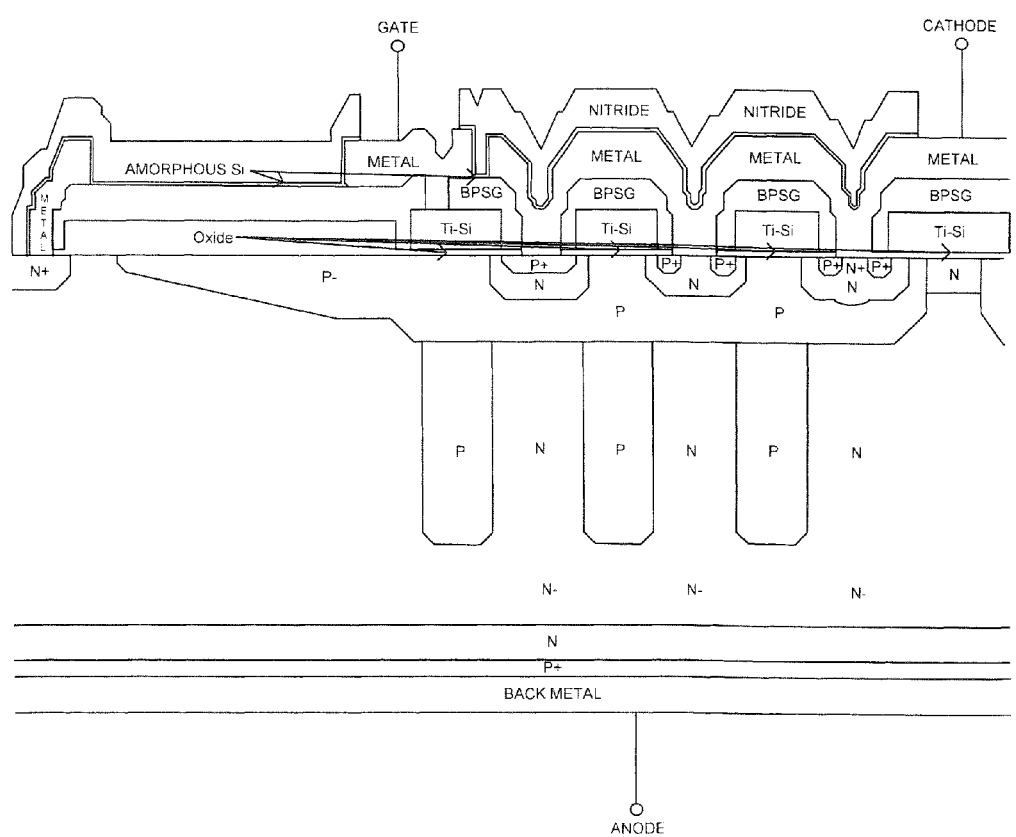
FIG. 4 is a partial cross section of a core cell (termination and repeated power channel) of the gated turn off thyristor with improved turn off time, as well as reduced drift region on resistance.

FIG. 4 is a partial cross section of a core cell (termination and repeated power channel) of the gated turn off thyristor with improved turn off time, as well as reduced drift region on resistance.

Figure 5:
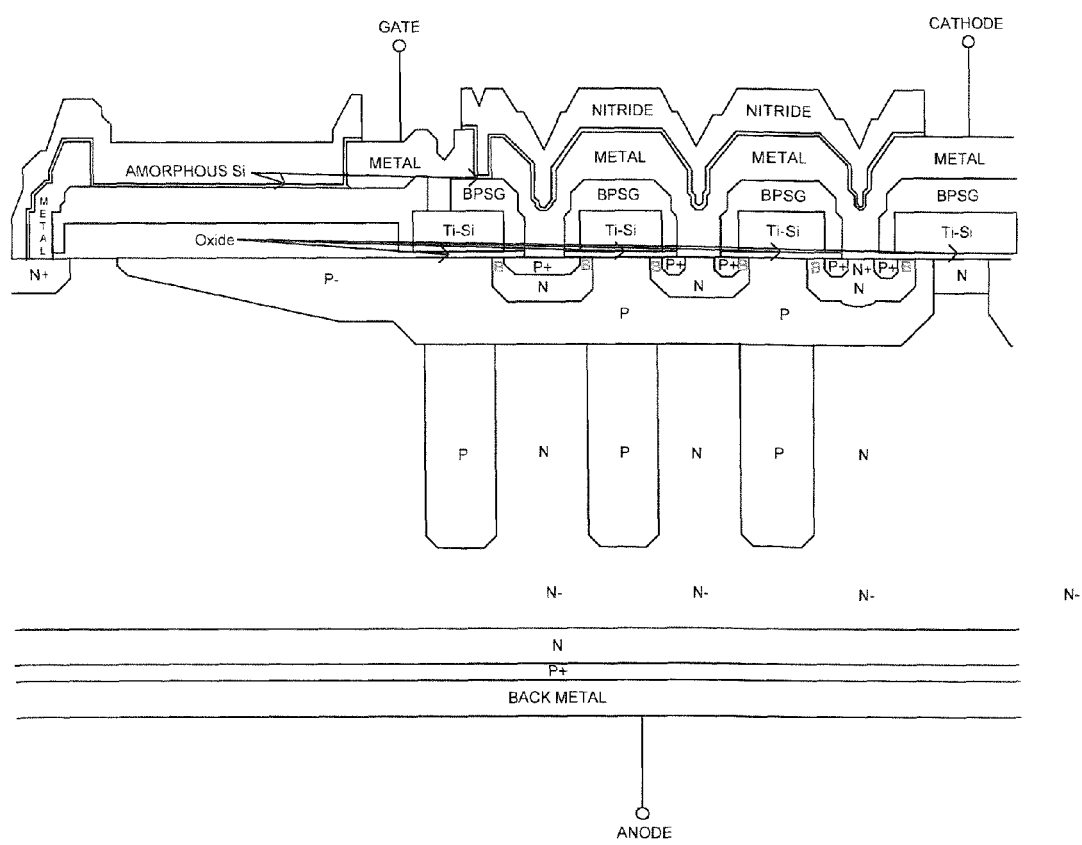

FIG. 5 is the same as FIG. 4 but with a positive threshold implant to make the turn off MOSFET normally on so that the device may operate with only a positive polarity rather than requiring a positive and negative gate drive. The B indicates Boron or a positive dopant implanted at the surface to make the vbe shorting p-channel MOSFET normally on.

The improved gated thyristor device of embodiments of the invention may be utilized in AC/DC offline supplies including emerging digital power and delta sigma power supplies. The controllers for these devices may be created monolithically using the same semiconductor layers as the inventive gated thyristor or with a co-packaged controller. In a specific embodiment the controller is a hysteretic controller, or a peak or average current mode controller. The controllers may provide feedback to the thyristor and to an output terminal, where the output voltage of the AC/DC converter is responsive to a pulse train on the gate of the gated turn off thyristor. The pulse train created by the controller in conformance with the feedback measurement is used to maintain a voltage or current output at the output terminal. A three terminal device may be used to regulate an isolated flyback controller with only three terminal connections using primary side regulation as follows: allow at least one cycle of discontinuous operation; measure the frequency of oscillations of the anode during said cycle; measure back ½ period from the start of the first such oscillation on the next and subsequent cycles; measure the voltage at this time when there is no current flowing in the flyback transformer and thus no regulation and measure this voltage, which is related to the output voltage by the duty cycle multiplied by the turns ratio plus a fixed voltage drop component. The aforementioned sequence is repeated every so often or after a transient event.

AC/DC converters may include a means to maintain current in conformance with input voltage to create power factor correction. Often this is accomplished by varying the current reference against the input voltage through use of a multiplier. A controller in the AC/DC converter has a power factor correction device that utilizes the multiplier to create a current mode control reference.

A transient voltage suppressor may be created by coupling a controller responsive to voltage to the anode of the gated thyristor, such that the controller enables the gated thyristor if the voltage on the anode rises above a threshold. Such a transient voltage suppressor could be used as a lighting protector, or if it were instead responsive to a current measurement then it could be used as a ground fault interrupter (GFI).

Figure 7:
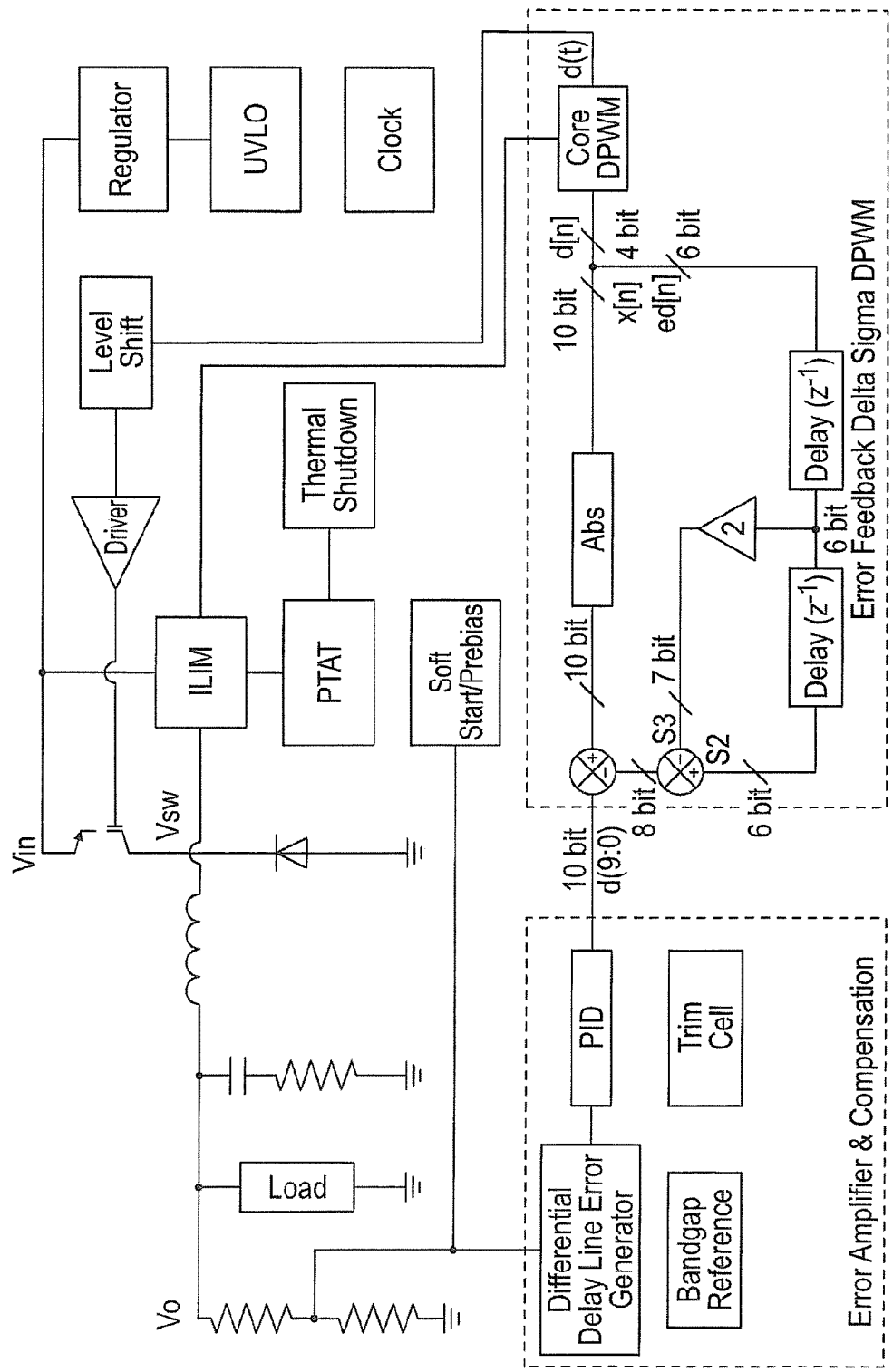
FIG. 7 shows a z-domain controller for an AC/DC or DC/DC converter that may be used with a gated turn off thyristor pass element according to an embodiment of the invention.

FIG. 7 shows a schematic of a z-domain controller for an AC/DC or DC/DC converter that may be used with a gated turn off thyristor pass element according to an embodiment of the invention. The z-domain controller outputs a pulse train conforming to a digital feedback enhanced z-domain delta sigma system such that the equivalent number of bits of duty cycle control is expanded through said delta sigma feedback.

The preferred embodiment of the inventions are described above, however, those skilled in the art will be able to replace n-enhancement devices with p-enhancement devices and create similar structures using the inventions introduced herein without which such structures would not be possible. There are numerous alternate structures and circuit which differ in their description but do not fundamentally alter the uniqueness of the inventions taught and still require their use for operation.

The foregoing description is illustrative of particular embodiments of the invention, but is not meant to be a limitation upon the practice thereof. The following claims, including all equivalents thereof, are intended to define the scope of the invention.

The invention claimed is:

1. A gated turn off thyristor device comprising:
   a current measuring device;
   a reference current conforming to a maximum turn off current capability of the thyristor device;
   a turn off device responsive to the current measurement device and the reference current wherein the thyristor device turns off when a measured current reaches said reference current; and
   wherein a threshold adjustment is utilized to create a normally on structure for a turn off device MOSFET of the thyristor device which shorts a base emitter region of a latch structure.

2. The thyristor device of claim 1, wherein the turn off device utilizes a metal strip.

3. The thyristor device of claim 1, wherein the turn off device utilizes a sense resistor.

4. The thyristor device of claim 1, wherein the current measuring device is an on chip metal resistor.

5. The thyristor device of claim 1, wherein the current measurement device and the turn off device are implemented utilizing a monolithic control circuit.

6. The thyristor device of claim 1, wherein the current measurement device and the turn off device are implemented utilizing a co-packaged control circuit.

7. A gated turn off thyristor which does not require a negative voltage be applied to turn it off comprising:
- a current measuring device;
- a reference current conforming to a maximum turn off current capability of the thyristor device;
- a turn off device responsive to the current measurement device and the reference such that the thyristor device turns off if a measured current reaches said reference current; and
- wherein a threshold adjustment is utilized to create a normally on structure for a turn off device MOSFET of the thyristor device which shorts a base emitter region of a latch structure.

8. The thyristor device of claim 7, wherein the current measuring device is an on chip metal resistor.

9. The thyristor device of claim 7, wherein the current measurement device and the turn off device are implemented utilizing a monolithic control circuit.

10. The thyristor device of claim 7, wherein the current measurement device and the turn off device are implemented utilizing a co-packaged control circuit.

* * * * *